United States Patent [19]

Mastroianni

[11] 4,119,446

[45] Oct. 10, 1978

[54] METHOD FOR FORMING A GUARDED SCHOTTKY BARRIER DIODE BY ION-IMPLANTATION

[75] Inventor: Sal Thomas Mastroianni, Mesa, Ariz.

[73] Assignee: Motorola Inc., Schaumburg, Ill.

[21] Appl. No.: 823,797

[22] Filed: Aug. 11, 1977

[51] Int. Cl.² .......................................... H01L 21/265
[52] U.S. Cl. ..................... 148/1.5; 357/15; 357/52; 357/91
[58] Field of Search ............................ 357/15, 52, 91; 148/1.5

[56] References Cited

U.S. PATENT DOCUMENTS

| 3,924,320 | 12/1975 | Altman et al. | 29/578 |
| 4,060,427 | 11/1977 | Barile et al. | 148/1.5 |
| 4,063,964 | 12/1977 | Peressini et al. | 148/1.5 |

FOREIGN PATENT DOCUMENTS

| 973,978 | 9/1975 | Canada | 357/15 |

OTHER PUBLICATIONS

Fang et al., "Making Ion-Implanted Self Aligned FET Using Silicide Met.", IBM-TDB, 14 (1972) 3687.
Buckley et al., ".... Pd₂Si Contacts on Single Xtal Si....", Solid State Electr., 15 (1972) 1331.
Battista et al., "Low Reverse Leakage Schottky Barrier Diode", IBM-TDB, 18 (1976) 3229.
Reith et al., "Al/PtSi SBD With a Diff. Barrier" IBM-TDB, 16 (1974) 3586.

*Primary Examiner*—L. Dewayne Rutledge
*Assistant Examiner*—Upendra Roy
*Attorney, Agent, or Firm*—Lowell E. Clark

[57] ABSTRACT

An improved method for forming a guard ring Schottky barrier diode using ion implantation. Diodes formed in accordance with this method require less area but exhibit breakdown voltage comparable to known prior art guarded Schottky barrier diodes. The method is especially applicable to the fabrication of monolithic integrated circuits.

7 Claims, 2 Drawing Figures a b c a b c

METHOD FOR FORMING A GUARDED SCHOTTKY BARRIER DIODE BY ION-IMPLANTATION

SUMMARY OF THE INVENTION

Schottky barrier diodes, also termed metal-semiconductor diodes, have been utilized both as discrete devices and as components in integrated circuits for many years. Schottky barrier diodes find especial utility in applications where fast switching speed or low forward drop are required. However, compared with conventional p-n junction diodes, Schottky barrier diodes exhibit an enhanced leakage particularly at voltages approaching breakdown voltages. This has been found to be due to the peripheral portion of the metal-semiconductor interface. The problem of enhanced leakage has usually been overcome by providing p-n junction guard ring at the periphery of the metal-semiconductor interface. While this requires increased area, soft breakdowns are essentially eliminated. In typical prior art sequences, the guard ring and the Schottky barrier are formed as a result of two independent photolithographic processes. A first mask opens an annulus in the masking film and the doping step, to form the guard ring is carried out through this hole. Then another mask is used to form the Schottky barrier diode so that its periphery falls within the confines of the guard ring previously established. Since two masks are used, the tolerances are additive and there is usually considerable unnecessary overlap of the metal-semiconductor barrier and the doped guard ring. In the process sequence to be described, the metal semiconductor structure is formed first. The metal is then used in conjunction with another mask to form a guard ring self-aligned with the periphery of the metal. In this way, not only is one etching step eliminated, but a significant area savings especially for small diodes is achieved.

DESCRIPTION OF THE PREFERRED EMBODIMENT(S)

Figure 1:
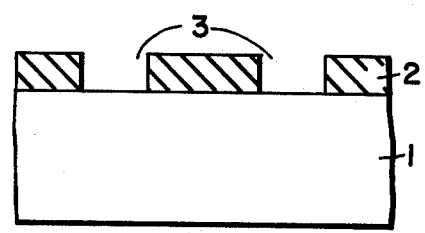
FIG. 1 depicts the essential process steps used in forming a guarded metal semiconductor diode in a typical prior art sequence.
Figure 1:
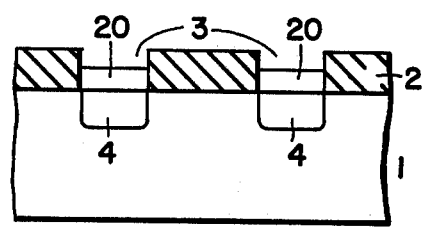
Figure 1:
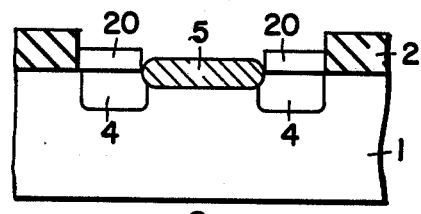

For comparison purposes a typical prior art process for fabricating guarded Schottky barrier diodes will be explained with reference to FIG. 1.

Body region 1 in FIG. 1a is a semiconductor substrate suitably doped to produce the Schottky barrier diode. While region 1 may be the entire substrate upon which the device is fabricated, it will be appreciated that it also may be a region of a larger substrate, for example an isolated island in a monolithic integrated circuit. This body portion is covered with an insulator 2 and to which aperture 3 has been formed by conventional photolithographic techniques. FIG. 1a shows two regions 3 inasmuch as this is a cross-section of a device wherein the opening 3 is a closed figure such as an annulus. Remaining regions 2 serve as a mask against a subsequent doping step which forms the region 4 of FIG. 1b in body region 1. Region 4 is of opposite conductivity type to region 1, and subsequently serves as the peripheral guard ring for the finished Schottky barrier diode.

The doping of region 4 is effected by conventional diffusion or ion implantation techniques which are well known in the art. Prior to further processing, another insulator region 20 is formed over doped region 4.

FIG. 1c shows a completed structure after formation of the metal semiconductor or Schottky barrier junction by formation of metal layer 5 on the body region 1. Prior to the forming of this metal region, the central insulating region 2 and the inner portion of insulating region 20 are removed by a conventional photolithographic process. Since the mask required to remove central region insulator 2 and the inner portion of region 20 is different from the one used to form the apertures 3 in insulating layer 2, metal layer 5 necessarily overlaps doped region 4 by an amount equal to the worst case mask tolerances. Likewise, the portion of doped region 4 not covered by metal layer 5 must also equal the worst case mask tolerance in order to be sure that the doped region 4 completely surrounds the periphery of the Schottky barrier diode. As a result, the example of FIG. 1c shows that the width in cross-section of the active Schottky barrier diode is approximately equal to the total width of the inactive area comprised of the guard ring region 4. The metal layer 5 is shown precisely aligned to the edge of insulator 20; this occurs because the Schottky barrier diode has been formed by deposition of a metal such as platinum which alloys or compounds with a semiconductor but does not adhere to either insulating layer 20 or insulating layer 2.

Figure 2:
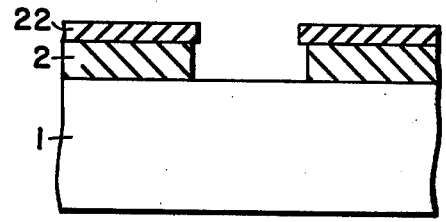
FIG. 2 shows the essential process steps for forming a guarded Schottky barrier diode by the sequence described hereinafter.
Figure 2:
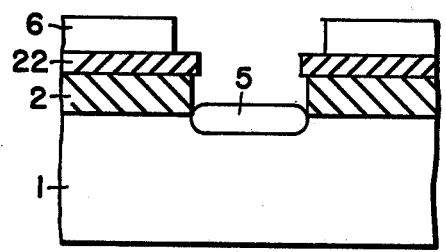
Figure 2:
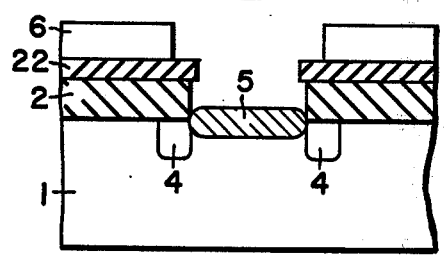

FIG. 2 represents a cross-sectional view of the preferred embodiment of the invention. FIG. 2a again shows a semiconductor body region 1 forming one of the electrodes of the Schottky barrier diode. This body region has been covered by a composite insulator comprising the region 2 typically silicon dioxide covered by another insulating layer 22 of a different etching rate, typically silicon nitride. An aperture is etched into this composite insulator resulting in a slightly stepped structure due to undercutting of layer 2 because of its faster etching rate. The resulting aperture 4 is used in the formation of the Schottky barrier diode which is effected by deposition of an alloying metal layer 5 as shown in FIG. 2b. The metal, which was deposited over the entire top surface of the structure, has been removed from the surface of the composite insulator structure leaving only that section which has chemically combined with region 1 silicon as explained in reference to the prior art process. A layer of photoresist 6 is then deposited over the entire top surface of the composite insulator and the metal layer. An aperture in this layer which closely surrounds metal layer 5 has been formed by printing with an oversize version of the same mask used to form aperture 4 in FIG. 1a. Thus the aperture in photoresist layer 6 is made to be somewhat larger than the aperture in the photoresist layer which formed aperture 4 through the composite insulator. FIG. 2c shows completed guarded Schottky barrier diode after the step of implanting through the composite insulator to form guard ring 4 self-aligned with and surrounding metal layer 5. Both photoresist layer 6 and metal layer 5 serve as a maskant for ions of a suitable energy which can penetrate the composite insulator in order to form doped region 4 of the opposite conductivity type to body region 1.

While the undercut composite insulator shown in FIG. 2a tends to protect the periphery of the Schottky barrier diode during further processing, the use of a composite insulator is not essential to this invention. Satisfactory results can also be obtained by the use of a homogeneous insulator without the undercut structure.

The invention is further illustrated by means of the following particular example:

PREFERRED EMBODIMENT

Semiconductor substrate region 1 is silicon with a resistivity of approximately 0.3–0.45 ohm-centimeter. The oxide thickness of insulator layer 2 is approximately 2000 Angstroms and the nitride thickness of layer 22 is approximately 1500 Angstroms. After cutting aperture 4 through the silicon nitride and the silicon oxide, standard vacuum techniques are used to deposit platinum which is then reacted with the silicon to form a platinum silicide layer of thickness 2000 Angstroms. After removal of the excess platinum over the insulating layers 2 and 22, a 0.1 mil oversize on each side (0.2 mil total in each axis) version of the same mask used to form aperture 4 is used to delineate an opening in a photoresist layer 6 of thickness approximately 1 micron. Boron is then implanced at an energy of 80 KeV to a dose of $7.3 \times 10^{13}$ singly charged $B_{11}$ ions. The implant is annealed at a temperature of 625° C. for 25 minutes after the removal of the photoresist layer 6. The annealing temperature must be kept below 800° C. in order to avoid decomposition of the platinum silicide. After the annealing step, the platinum silicide 5 is over-metallized, typically with silicon aluminum metallization or with a composite barrier-conductive metal comprised of TiW-Al. The finished diodes exhibited forward voltages of about 400 mv at 10 microamps forward current and reverse breakdown voltages of about 30 volts at 10 microamps current level.

The same process sequence was carried with a platinum silicide thickness of 1000 Angstroms; in this case, the forward voltage of the diodes was increased significantly, indicating substantial penetration of the silicon in the intended Schottky area by the implanted boron ions. Similarly, when the energy of the implant was increased to 140 KeV, forward voltage on diodes of 2000 Angstroms platinum silicide thickness was also significantly enhanced, again indicating penetration of the silicon beneath the platinum silicide layer 5 by the boron atoms.

What is claimed is:

1. A method for forming on a semiconductor substrate portion of first conductivity type a metal-semiconductor diode surrounded directly by a doped-guard ring of second conductivity-type and further surrounded directly by an insulating layer on said substrate, comprising ion-implanting said substrate through said insulating layer using said metal as a mask.

2. The method of claim 1 further including providing an implant mask surrounding and spaced from said metal.

3. The method of claim 1 where an aperture in said insulator delineates said metal-semiconductor diode.

4. The method of claim 2 where said spacing is uniform about the periphery of the diode.

5. The method of claim 2 where an aperture in said insulator delineates said metal-semiconductor diode.

6. A method for forming a guarded Schottky barrier diode on a semiconductor substrate covered by an insulator comprising:
    forming a first aperture in said insulating layer;
    forming a metal semiconductor diode coextensive with said aperture;
    forming a masking layer over said insulator;
    providing a second aperture in said masking layer, said second aperture being an oversize replica of said first aperture; and
    doping said substrate through second aperture and said insulating layer to provide a junction guard ring surrounding said metal-semiconductor diode.

7. The method of claim 6 where said junction guard ring is in precise alignment with said metal-semiconductor diode.

* * * * *